(12) United States Patent
Mitchell

(10) Patent No.: US 6,595,269 B2
(45) Date of Patent: Jul. 22, 2003

(54) FLEXIBLE HEAT PIPE STRUCTURE AND ASSOCIATED METHODS FOR DISSIPATING HEAT IN ELECTRONIC APPARATUS

(75) Inventor: Nathan A. Mitchell, The Woodlands, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 13 days.

(21) Appl. No.: 09/859,877

(22) Filed: May 17, 2001

(65) Prior Publication Data

US 2001/0022720 A1 Sep. 20, 2001

(Under 37 CFR 1.47)

Related U.S. Application Data

(62) Division of application No. 09/317,322, filed on May 24, 1999.

(51) Int. Cl.[7] .................................................. F28F 5/00
(52) U.S. Cl. ............... 165/86; 165/104.33; 165/104.26; 361/687
(58) Field of Search ............................ 165/185, 104.33, 165/86, 104.26; 361/687, 725, 700

(56) References Cited

U.S. PATENT DOCUMENTS

| 5,313,362 A | 5/1994 | Hatada et al. ............... 361/709 |
| 5,383,340 A | 1/1995 | Larson et al. ............... 62/259.2 |
| 5,588,483 A | 12/1996 | Ishida .......................... 165/86 |
| 5,621,613 A | 4/1997 | Haley et al. .................. 361/687 |
| 5,646,882 A | 7/1997 | Bhati aet al. ................ 361/687 |
| 5,781,409 A | 7/1998 | Mecredy, III ................. 361/687 |
| 6,031,716 A | * 2/2000 | Cipolla et al. ............... 361/687 |
| 6,134,106 A | * 10/2000 | Tao et al. ............... 165/104.33 |
| 6,141,216 A | * 10/2000 | Holung et al. ............... 361/700 |
| 6,148,906 A | * 11/2000 | Li et al. ................. 165/104.33 |
| 6,189,602 B1 | * 2/2001 | Tanahashi et al. ............. 165/86 |
| 6,226,178 B1 | * 5/2001 | Broder et al. ................ 361/687 |

FOREIGN PATENT DOCUMENTS

EP          0 702 287 A2    3/1996    ............. G06F/1/20

* cited by examiner

Primary Examiner—Henry Bennett
Assistant Examiner—Terrell McKinnon

(57) ABSTRACT

A notebook computer has a base housing with a heat-generating microprocessor therein, and a lid housing pivotally connected to the base housing. Operating heat from the microprocessor is transferred to the lid housing, for dissipation therefrom, via a specially designed thermosyphoning heat pipe structure formed from first and second heat pipes. The first heat pipe representatively has a rectangular cross-section, an evaporating portion thermally communicated with the microprocessor, and a coiled condensing portion centered about the lid hinge line and having a circularly cross-sectioned interior side surface portion defined by flat sides of the first heat pipe. The second heat pipe has a circular cross-section, an evaporating portion pivotally received within the coiled first heat pipe portion, and a condensing portion thermally communicated with the lid housing. When the lid housing is opened and closed, the evaporating portion of the second heat pipe is rotated within the coiled first heat pipe portion and slidably engages its circularly cross-sectioned interior side portion.

25 Claims, 2 Drawing Sheets

FLEXIBLE HEAT PIPE STRUCTURE AND ASSOCIATED METHODS FOR DISSIPATING HEAT IN ELECTRONIC APPARATUS

This application is a divisional of application Ser. No. 09/317,322, filed May 24, 1999.

BACKGROUND OF THE INVENTION

1. Field of the Invention

The present invention generally relates to electronic apparatus and, in a preferred embodiment thereof, more particularly relates to apparatus and methods for dissipating component operating heat in electronic devices such as computers.

2. Description of Related Art

As the increasingly popular notebook computer continues to be provided with higher speed electronic components and correspondingly greater computing power and functionality, the need to sufficiently dissipate operating heat from high heat generating components in the computer becomes correspondingly greater.

As conventionally constructed, a notebook computer has a base housing, within which the primary heat generating components (such as the computer's microprocessor) are disposed, and a substantially thinner display lid housing pivotally connected to the base housing with a hinge structure. One previously proposed solution to this heat dissipation problem has been to utilize a heat pipe structure to transfer operating heat from a component within the computer base housing, such as the microprocessor, to the display lid housing for dissipation therefrom to ambient when the computer is operating and the lid housing is in its open position.

Previously proposed heat pipe-based structures used to perform this base-to-lid heat transfer function have been incorporated in or positioned adjacent the computer lid hinge structure for relative pivotal movement between base and lid portions of the heat transfer structure in response to the opening and closing of the lid. These previously utilized heat pipe-based heat transfer structures have typically carried with them the undesirable characteristics of complexity, relatively high weight and cost, and rather involved assembly requirements.

A need thus exists for an improved heat pipe-based hinge area heat transfer apparatus and associated methods that eliminate or at least substantially minimize these disadvantages. It is to this need that the present invention is directed.

SUMMARY OF THE INVENTION

In carrying out principles of the present invention, in accordance with a preferred embodiment thereof, specially designed heat transfer apparatus is provided which is representatively useable to transfer operating heat from an electronic component disposed within a housing portion of an electronic apparatus, such as a portable computer, to a lid portion pivotally mounted on the housing for dissipation from the lid portion.

The heat transfer apparatus is of a quite simple construction and basically comprises two thermosyphoning heat pipes. The first heat pipe has a first longitudinal portion, and a second longitudinal portion helically coiled about an axis and defining a generally tubular structure having an interior side surface. Preferably, the first heat pipe, which illustratively has a square cross-section, has a flat outer side surface portion that defines the interior side surface of the generally tubular structure. The second heat pipe has a first longitudinal portion coaxially and rotatably received in the generally tubular structure in heat transfer engagement with its interior side surface, and a second longitudinal portion disposed exteriorly of the generally tubular structure.

Representatively, the heat transfer apparatus is incorporated in a portable computer, illustratively a notebook computer, having a base housing with a heat-generating component therein (representatively a microprocessor), and a lid housing structure secured to the base housing for pivotal movement relative thereto about a hinge line axis. The first longitudinal portion of the first heat pipe is held in thermal communication with the heat-generating component within the base housing, the generally tubular structure is supported in a coaxial relationship with the hinge line, and the second longitudinal portion of the second heat pipe is carried by the lid housing structure in thermal communication with a portion thereof. As the lid housing is opened and closed, the first longitudinal portion of the second heat pipe is rotated within the coiled, generally tubular portion of the first heat pipe. During operation of the computer, operating heat from the microprocessor is transferred to a portion of the lid housing, for dissipation from the lid housing, sequentially via the first longitudinal portion of the first heat pipe, the generally tubular structure, the first longitudinal portion of the second heat pipe, and the second longitudinal portion of the second heat pipe.

In accordance with another aspect of the invention, a special method is used to easily and quickly fabricate the heat transfer apparatus. From a broad perspective, such method comprises the steps of providing a first thermosyphoning heat pipe; helically coiling a first longitudinal portion of the first thermosyphoning heat pipe about an axis to form a generally tubular structure having an interior side surface; providing a second thermosyphoning heat pipe; and positioning a first longitudinal portion of the second thermosyphoning heat pipe coaxially within the generally tubular structure, in slidable heat transfer contact with the interior side surface thereof, for rotation relative to the generally tubular structure about its axis.

Representatively, the first thermosyphoning heat pipe has a flat side surface portion, and preferably has a square cross-section. According to a further aspect of the invention, the method further comprises the step, performed prior to the insertion of the first longitudinal portion of the second heat pipe into the interior of the generally tubular structure, of radially outwardly deforming the interior side surface of the generally tubular structure relative to its outer side surface to increase the inner diameter of the generally tubular structure.

Representatively, this radially outwardly deforming step includes the steps of restraining the outer side surface of the generally tubular structure against radial enlargement thereof while axially forcing a diametrically oversized cylindrical structure through the interior of the generally tubular structure, thereby desirably increasing the circularity of the inner side surface of the generally tubular structure and correspondingly increasing the overall heat transfer contact area between the inner side surface of the generally tubular structure and the first longitudinal portion of the second thermosyphoning heat pipe.

In a preferred embodiment of this fabrication method, the method further comprises the step of providing a cylindrical mandrel having a first longitudinal portion and a second, larger diameter portion. The helically coiling step is performed by helically coiling the first longitudinal portion of the first thermosyphoning heat pipe around the first longitudinal portion of the cylindrical mandrel, and the restraining step is performed by coaxially inserting the generally tubular structure into a tubular restraining member configured to closely receive it. The radially outwardly deforming step includes the steps of forcing the second, larger diameter mandrel portion coaxially through the interior of the previously formed generally tubular structure while using the contact between the generally tubular structure and the tubular restraining member to prevent radial enlargement of the outer side surface of the generally tubular structure. After these steps are performed, the first longitudinal portion of the second heat pipe is coaxially and rotatable inserted into the interior of the generally tubular structure in sliding heat transfer engagement with its radially expanded inner side surface.

DETAILED DESCRIPTION

Figure 1:
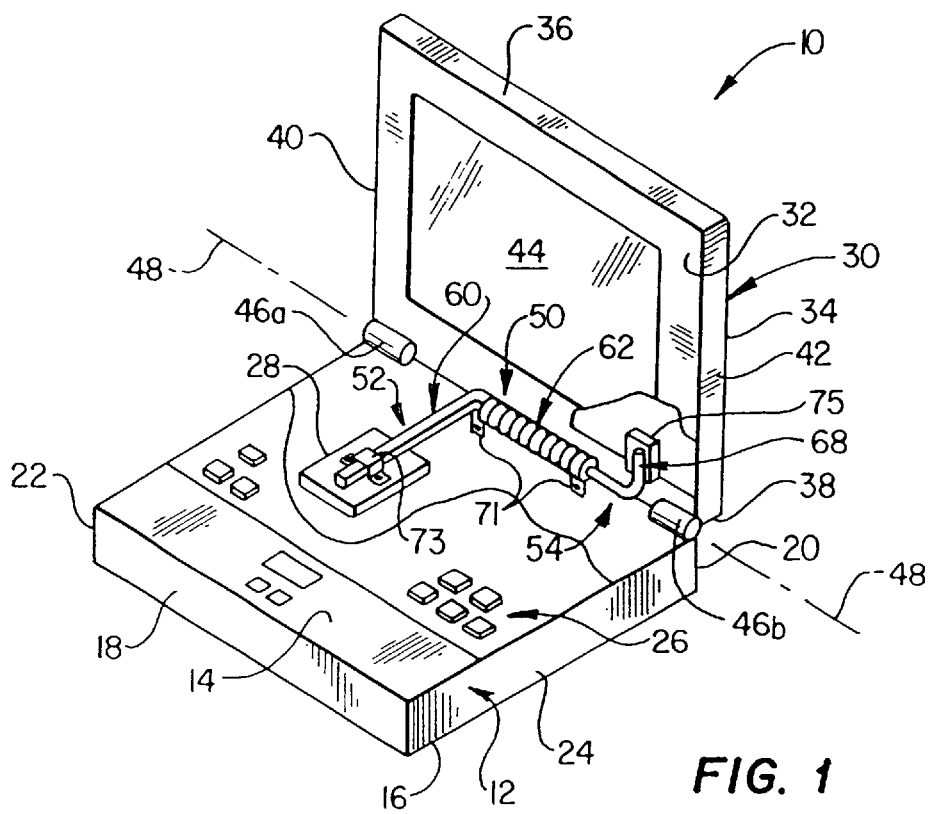
FIG. 1 is a partially cut away simplified perspective view of a representative notebook computer incorporating therein a specially designed flexible heat pipe structure embodying principles of the present invention and operative to transfer component operating heat from the computer's base housing to its display lid housing.
Figure 2:
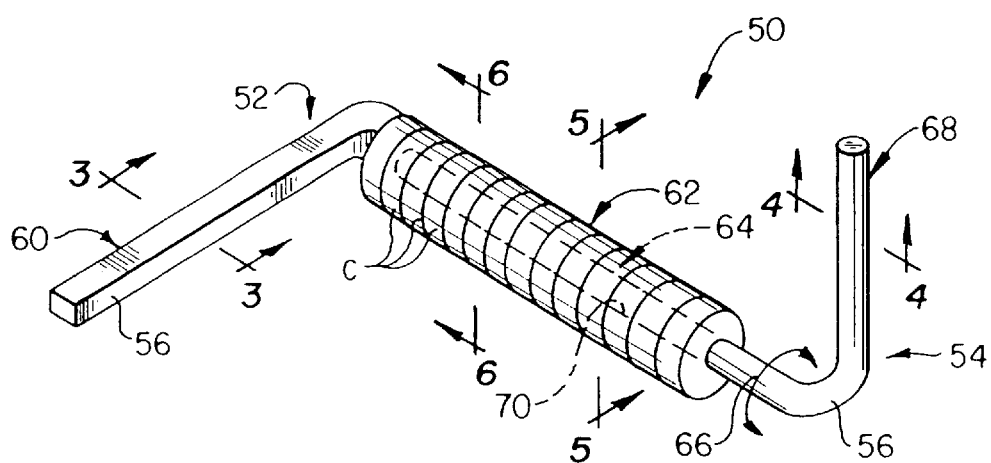
FIG. 2 is an enlarged scale perspective view of the flexible heat pipe structure removed from the computer.

Specially designed electronic apparatus 10, which is representatively in the form of a portable notebook computer, is perspectively illustrated in simplified form in FIG. 1 and embodies principles of the present invention. Notebook computer 10 includes a rectangular base housing 12 having top and bottom side walls 14 and 16, front and rear side walls 18 and 20, and left and right end walls 22 and 24. A keyboard 26 is operatively disposed on the top side wall 14, within a suitable opening therein, and various electronic components, such as the schematically depicted microprocessor 28, are carried within the interior of the base housing 12 beneath its top side wall 14 and keyboard 26. During operation of the computer 10, the microprocessor 28 generates a considerable amount of heat which, in a manner subsequently described herein, is dissipated from the base housing 12 using principles of the present invention.

The computer 10 also includes a rectangular lid housing structure 30 which is considerably thinner than the base housing 12 and has (as viewed in FIG. 1) opposite front and rear side walls 32 and 34, opposite top and bottom side walls 36 and 38, and opposite left and right end walls 40 and 42. A display screen 44 is mounted on the front side wall 32, and a bottom edge portion of the lid housing structure 30 is secured to an upper rear edge portion of the base housing 12, by a hinge structure 46a, 46b. The hinge structure 46a, 46b permits the lid housing 30 to be pivoted relative to the base housing 12 about a hinge axis 48, between a generally vertical use orientation shown in FIG. 1 (in which the display screen 44 faces the user of the computer 10), and a generally horizontal closed storage and transport orientation (not shown) in which the lid housing 30 extends across and covers the top base housing side wall 14 and keyboard 26 of the computer 10. Suitable latch means (not shown) of conventional design are provided for releasably holding the lid housing 30 in its closed orientation.

In accordance with an illustrated preferred embodiment of the present invention, operating heat from the microprocessor 28 within the base housing 12 is transferred to a portion of the lid housing structure 30, for dissipation therefrom when the lid housing 30 is in its is opened orientation, by specially designed heat transfer apparatus 50 which will now be described with reference to FIGS. 1–6.

Figure 3:
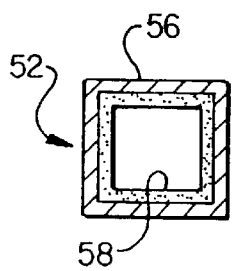
FIG. 3 is an enlarged scale cross-sectional view taken through the flexible heat pipe structure along line 3—3 of FIG. 2.
Figure 3A:
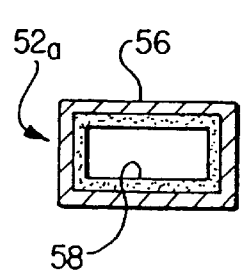
FIGS. 3A and 3B are views similar to that in FIG. 3 but illustrating representative alternate cross-sectional shapes of a first heat pipe portion of the overall heat pipe structure.
Figure 3B:
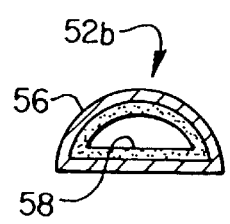
Figure 4:
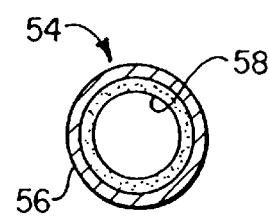
FIG. 4 is an enlarged scale cross-sectional view taken through the flexible heat pipe structure along line 4—4 of FIG. 2.
Figure 5:
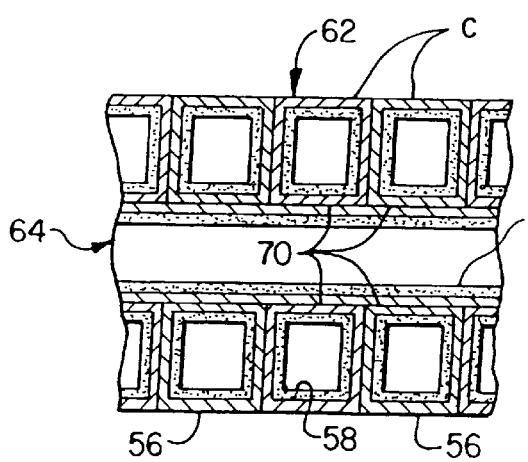
FIG. 5 is an enlarged scale cross-sectional view taken through the flexible heat pipe structure along line 5—5 of FIG. 2.

Heat transfer apparatus 50 includes first and second thermosyphoning heat pipes 52 and 54. Each of the heat pipes 52,54 (see FIGS. 3 and 4) is of a conventional construction, having an outer metal pipe portion 56, a suitable wicking material 58 lining the interior of pipe portion, and a small amount of working liquid (not shown) disposed within the interior of the pipe portion. The cross-section of the first heat pipe 52 (see FIG. 3) is preferably square, but may alternatively have other cross-sections with at least one flat exterior side surface such as the rectangular cross-section of the alternately configured first heat pipe 52a shown in FIG. 3A, or the semicircular cross-section of the alternately configured first heat pipe 52b shown in FIG. 3B. The second heat pipe 54 (see FIG. 4) has a circular cross-section.

The first heat pipe 52 has an evaporating end portion 60, and a condensing end portion which, in a manner later described herein, is coiled about an axis to form a generally tubular structure 62. The second heat pipe 54 has an evaporating end portion 64 which is coaxially and rotatably received within the interior of the tubular structure 62 for rotation relative thereto about its axis, as indicated by the double-ended arrow 66 in FIG. 2, and a condensing end portion 68 extending at an angle to the evaporating end portion 64. The coiled tubular structure 62 has a circularly cross-sectioned interior side surface 70 (see FIGS. 5 and 6) defined by flat exterior side surface portions of the individual heat pipe coils C (see FIGS. 2 and 5) of the tubular portion 62 of the first heat pipe 52. This circularly cross-sectioned interior side surface 70 is slidably engaged by, and in intimate heat transfer contact with, the circular outer side surface of the second heat pipe evaporating end portion 64. While it is preferred that the first heat pipe 52 have at least one flat exterior side surface portion useable to form the interior side surface 70 of the tubular structure 62, the first heat pipe 52 could alternately have a circular cross-section.

Referring now to FIG. 1, the heat pipe-based heat transfer apparatus 50 is installed in the computer 10 by using suitable brackets 71 to mount the tubular structure 62 coaxially with the hinge axis 48 between the hinge sections 46a and 48b, thermally communicating the evaporating end 60 of the first heat pipe 52 with the microprocessor 28 using, for example, a clamping structure 73, and thermally communicating the condensing end portion 68 of the second heat pipe 54 with a portion of the lid structure 30 by, for example, securing the condensing end portion 68 to a heat conductive thermal block member 75 that engages the rear side wall 34 of the lid structure 30. Alternate methods could, of course, be used to thermally communicate the evaporating end 60 of the first heat pipe 52 with the microprocessor 28, and thermally communicate the evaporating end condensing end 68 of the second heat pipe 54 with a portion of the lid structure 30.

During operation of the computer 10, with its lid 30 opened as shown in FIG. 1, operating heat from the microprocessor 28 is transferred to a portion of the lid structure 30, for dissipation from the lid structure 30, sequentially via the portions 60,62 of the first heat pipe 52 and the portions 64,68 of the second heat pipe 54. When the lid structure 30 is closed, the heat pipe portion 64 simply pivots within the interior of the tubular heat pipe structure 64 to move the heat pipe portion 68 downwardly into a generally parallel relationship with the heat pipe portion 60.

Figure 7A:
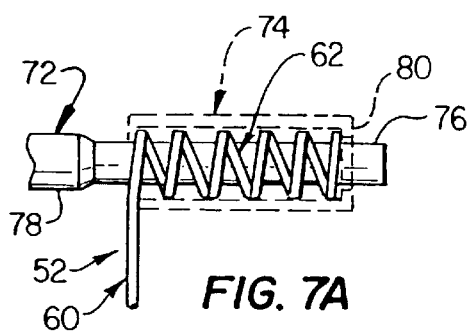
FIGS. 7A–7C are highly schematic diagrams illustrating a representative method by which the flexible heat pipe structure is fabricated.
Figure 7B:
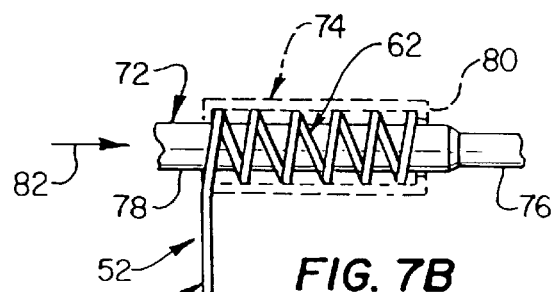
Figure 6:
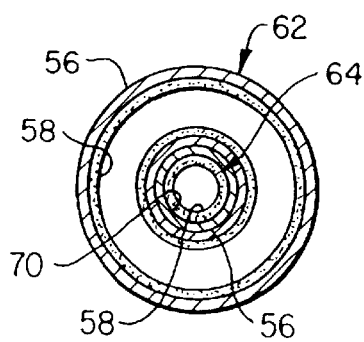
FIG. 6 is an enlarged scale cross-sectional view taken through the flexible heat pipe structure along line 6—6 of FIG. 2.

According to an aspect of the present invention, the overall heat transfer apparatus 50 is preferably formed using a unique fabrication method sequentially depicted in schematic form in FIGS. 7A–7B using a cylindrical mandrel member 72 and a tubular restraining member 74. The mandrel member has a first cylindrical end portion 76, and a second, slightly larger diameter end portion 78. For purposes later described, the tubular restraining member 74 has, at its open right end, an inturned annular flange section 80.

In forming the heat transfer apparatus 50, the condensing end portion of the first heat pipe 52 is tightly wound around the smaller diameter end portion 76 of the mandrel 72 (see FIG. 7A) to form the tubular heat pipe structure 62, and the tubular restraining member 74 (which is sized to closely receive the tubular structure 62) is coaxially slipped over the tubular structure 62 until the flange 80 outwardly abuts the right end of the tubular structure 62.

Next, as schematically depicted in FIG. 7B, the mandrel 72 is moved rightwardly through the interior of the tubular structure 62, as indicated by the arrow 82, in a manner causing the larger diameter mandrel portion 78 to forcibly engage the interior side surface 70 of the tubular portion 62 and radially outwardly deform it relative to the outer side surface of the tubular structure 62 which is restrained against radial enlargement by its contact with the interior side surface of the tubular restraining member 74. This radially outward deformation of the interior side surface 70 of the tubular heat pipe structure 62 gives a desirably more precise roundness to the interior side surface 70 to thereby increase the sliding heat transfer contact area between the interior side surface 70 and the evaporating end portion 64 of the second heat pipe 54 when assembly of the heat transfer structure 50 is completed.

Figure 7C:
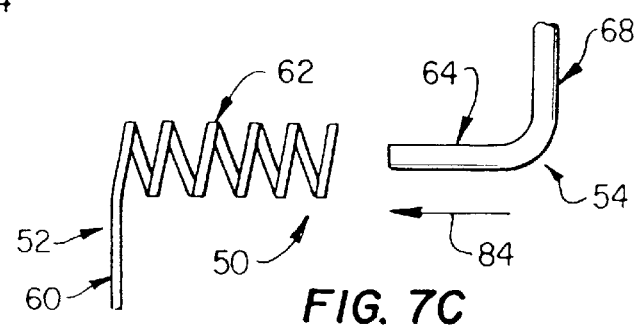

Finally, after interior side surface 70 of the tubular heat pipe structure 62 has been radially expanded in this manner, the evaporating end portion 64 of the second heat pipe 54 (see FIG. 7C) is coaxially and slidably inserted into the interior of the tubular structure 62 as indicated by the arrow 84. The completed heat transfer apparatus 50 may then be installed in the computer 10 as previously described herein.

While the heat transfer apparatus 50 has been representatively illustrated and described herein as being incorporated in a portable notebook computer, it will be readily appreciated by those of skill in this particular art that it could alternatively be incorporated in a variety of other types of electronic devices. Additionally, the heat transfer apparatus 50 could be used in conjunction with a variety of types of heat-generating components other than the representatively depicted microprocessor 28.

The foregoing detailed description is to be clearly understood as being given by way of illustration and example only, the spirit and scope of the present invention being limited solely by the appended claims.

What is claimed is:

1. A portable computer, comprising:
   a housing structure with a heat generating component;
   a display pivotably connected to the housing structure; and
   a heat pipe structure having:
      a first heat pipe in thermal communication with a heat generating component, and
      a second heat pipe connected in thermal communication with the lid, wherein the second heat pipe and the first heat pipe are pivotably coupled to each other, wherein at least one of the first and the second heat pipes is wrapped about the other.

2. The portable computer as recited in claim 1, wherein one of the first or second heat pipe comprises a coiled portion to pivotably receive the other of the first or second heat pipe.

3. The portable computer as recited in claim 1, wherein the first heat pipe comprises a coiled portion for pivotably receiving a longitudinal end of the second heat pipe.

4. The portable computer as recited in claim 1, wherein the first heat pipe comprises a rectangular cross section.

5. The portable computer as recited in claim 1, wherein the first heat pipe comprises a semi-circular cross section.

6. The portable computer as recited in claim 1, wherein the portable computer comprises a notebook computer.

7. The portable computer as recited in claim 1, where the heat generating component comprises a microprocessor.

8. A portable computer, comprising:
   a housing structure;
   a lid pivotably connected to the housing structure; and
   a heat pipe structure having
      a first heat pipe having a longitudinal portion connected with the housing structure in thermal communication with a heat generating component, the first heat pipe also having a coiled portion, and
      a second heat pipe having a portion thermally coupled within the coiled portion of the first heat pipe, and a second portion connected in thermal communication with the lid.

9. The portable computer as recited in claim 8, wherein the first heat pipe comprises a rectangular cross section.

10. The portable computer as recited in claim 8, wherein the first heat pipe comprises a semi-circular cross section.

11. The portable computer as recited in claim 8, wherein the portable computer comprises a notebook computer.

12. The portable computer as recited in claim 8, where the heat generating component comprises a microprocessor.

13. A computer, comprising:
   a housing structure;
   a panel connected to the housing structure; and
   a heat pipe structure having:
      a first heat pipe in thermal communication with a heat generating component located in the housing structure, and
      a second heat pipe pivotably coupled with the first heat pipe, the second heat pipe having longitudinal portion in thermal communication with the panel, wherein one of the first and second heat pipe is at least partially coiled to form a coiled portion for pivotably receiving a pivot end of the other.

14. The computer as recited in claim 13, wherein the first heat pipe comprises the coiled portion.

15. The computer as recited in claim 13, wherein the panel and the housing structure are pivotably coupled.

16. The computer as recited in claim 13, wherein the panel comprises a lid for the housing structure.

17. The computer as recited in claim 13, wherein the panel comprises a display coupled to the housing structure.

18. The computer as recited in claim 13, wherein the first heat pipe comprises a rectangular cross section.

19. The computer as recited in claim 13, wherein the first heat pipe comprises a semi-circular cross section.

20. The computer as recited in claim 13, wherein the computer comprises a portable computer.

21. The computer as recited in claim 13, wherein the computer comprises a notebook computer.

22. The computer as recited in claim 13, wherein the heat generating component comprises a microprocessor.

23. A portable computer, comprising:

a housing structure; and a lid pivotably connected to the housing structure; and a heat pipe structure having a first heat pipe comprising a coiled heat pipe portion and a second heat pipe pivotably coupled to the coiled heat pipe portion of the first heat pipe, wherein the second heat pipe pivots relative to the first heat pipe when the lid is pivoted relative to the housing structure.

24. The portable computer as recited in claim 23, further comprising a microprocessor disposed in the housing structure in thermal communication with the heat pipe structure.

25. The portable computer as recited in claim 23, wherein the housing structure comprises a notebook computer housing structure.

* * * * *